United States Patent [19]

Tamura et al.

[11] Patent Number: 4,540,167

[45] Date of Patent: Sep. 10, 1985

[54] APPARATUS FOR MOUNTING A RECORDING MEDIUM

[75] Inventors: Kaoru Tamura; Kiichiro Sakamoto, both of Kanagawa, Japan

[73] Assignee: Fuji Photo Film Co., Ltd., Kanagawa, Japan

[21] Appl. No.: 447,554

[22] Filed: Dec. 7, 1982

[30] Foreign Application Priority Data

Dec. 21, 1981 [JP] Japan ................................ 56-207711

[51] Int. Cl.3 ................................................ B65H 5/08

[52] U.S. Cl. ...................................... 271/11; 271/104; 271/168; 271/107; 271/232; 271/275

[58] Field of Search ................... 271/11, 13, 104, 107, 271/18.3, 232, 233, 168, 275

[56] References Cited

U.S. PATENT DOCUMENTS 3,041,069 6/1962 Bakelaar ......................... 271/168 X
3,108,799 10/1963 Clemens .......................... 271/168 X
3,360,258 12/1967 Nix ...................................... 271/168
4,214,741 7/1980 Crawford ....................... 271/18.3 X
4,453,709 6/1984 Reba .................................... 271/195
4,502,677 3/1985 Senga ............................. 271/168 X

FOREIGN PATENT DOCUMENTS 112322 12/1968 Denmark ........................... 271/104

*Primary Examiner*—Richard A. Schacher
*Attorney, Agent, or Firm*—Sughrue, Mion, Zinn, Macpeak and Seas

[57] ABSTRACT

An apparatus for mounting a recording medium having positioning apertures on a mount with positioning pins which are engageable with the apertures. A support having pins engageable with the apertures supports a plurality of recording mediums. A transfer mechanism is reciprocating between a first position in which the mechanism picks up a recording medium from the support, and a second position in which the mechanism delivers the recording medium to the mount.

9 Claims, 11 Drawing Figures

10
11A (11B)
8A (8B)
6
7
B
C
9A (9B)
1
12A
12B
5
4A (4B)
D
3
13B
1
13A
A

APPARATUS FOR MOUNTING A RECORDING MEDIUM

BACKGROUND OF THE INVENTION

This invention relates to an apparatus for mounting a recording medium. More particularly, it relates to an apparatus for mounting a recording medium having positioning apertures on a mount with positioning pins which are engageable with those apertures.

Apparatus employing a laser beam to expose a recording medium, such as photographic film, photographic printing paper, and lith film (lithographic film), PS plate or other printing material are known in the prior art. This exposure apparatus includes a mount for a recording medium having a base plane against which the base edge of a recording medium is brought into abutment so that the recording medium may be held in position for proper exposure. If the mount does not have a flat surface, but is, for example, cylindrical, a recording medium having positioning apertures is used. In this situation, the mount has positioning pins which extend from its cylindrical surface and are engageable with the apertures of the recording medium to hold it on the mount. No suitable apparatus has, however, been available for mounting a recording medium having such apertures on the mount. All the work has had to be done manually.

SUMMARY OF INVENTION

Given these deficiencies, it is an object of this invention to provide a suitable apparatus for mounting a recording medium having positioning apertures on a mount having positioning pins which are engageable with those apertures.

It is another object of this invention to define a system for mounting a recording medium that eliminates manual operation and does not damage the recording medium.

These objects of this invention are attained by an apparatus comprising a support having pins which are engageable with the apertures of a recording medium to support a plurality of recording mediums. A mechanism which is reciprocatable between a first position in which the mechanism picks up one recording medium from the support, and a second position in which the mechanism, delivers the recording medium to the mount.

The invention will now be described in detail by way of example with reference to the drawings.

DESCRIPTION OF THE PREFERRED EMBODIMENTS

Figure 1:
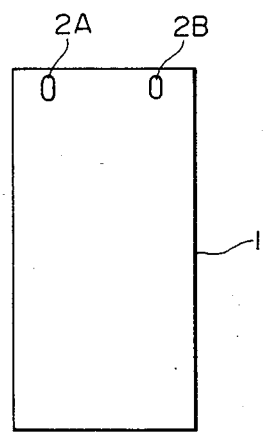
FIG. 1 is a plan view of a film to be mounted.

FIG. 1 shows a lith film which is one of the recording mediums which can be mounted by the apparatus of this invention. The film 1 has a pair of positioning apertures 2A and 2B. The shape and position of the apertures 2A and 2B depend on those of positioning pins on an exposure drum.

Figure 2:
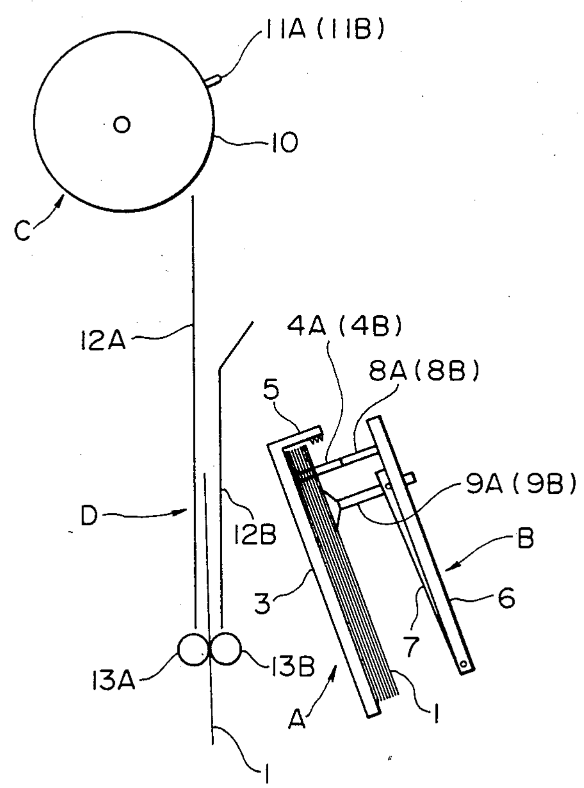
FIGS. 2 and 3 are fragmentary side elevational views of a first embodiment embodying the invention at different stages of operation.
Figure 3:
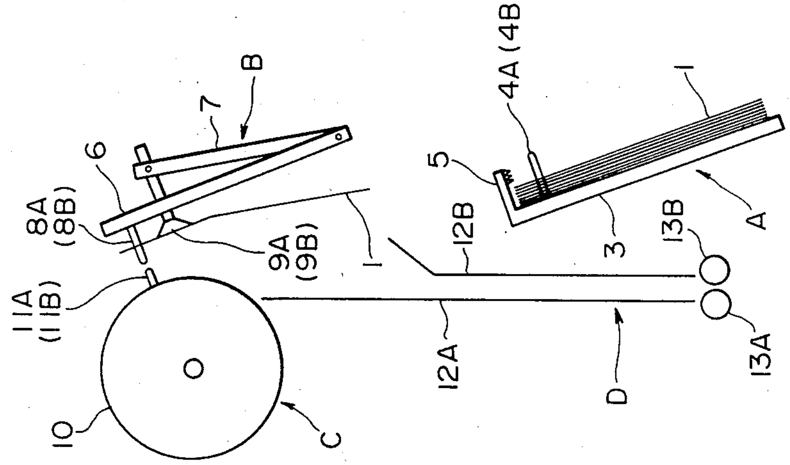

FIGS. 2 and 3 are fragmentary side elevational views of an apparatus embodying this invention. The apparatus comprises a film support A, and a suction film transfer mechanism B. FIGS. 2 and 3 also show an exposure drum C, and a guide D for conveying an exposed film to a developing apparatus.

The film support A comprises a base plate 3 supported on a structure not shown, supporting pins 4A and 4B extending from the base plate 3, and a separating member 5 provided at the top of the base plate 3. The pins 4A and 4B are so positioned to be engageable with the apertures 2A and 2B of the film 1 shown in FIG. 1.

The suction film transfer mechanism B is reciprocatable by a mechanism not shown between a first position in which it faces the film support A shown in FIG. 2 and a second position in which it faces the drum C, shown in FIG. 3. The mechanism B comprises a base frame 6, an auxiliary frame 7 supported rotatably on the base frame 6, transfer pins 8A and 8B projecting from the base frame 6 and, suction members 9A and 9B attached to the auxiliary frame 7 and connected to a source of evacuation not shown.

The exposure unit C comprises a film supporting drum 10 which is rotatably supported, positioning pins 11A and 11B projecting from the drum 10, and means for exposure and drum rotation which are not shown. The pins 11A and 11B are, of course, positioned on the drum to be engageable with the apertures 2A and 2B, respectively, of the film 1 shown in FIG. 1.

The film guide D comprises a pair of guide members 12A and 12B, and a pair of conveyor rollers 13A and 13B. It is possible to substitute therefor the film inlet of the developing apparatus.

The operation of the apparatus will be described with reference to FIGS. 2 and 3. FIG. 2 shows the first position of the transfer mechanism B in which it faces the film support A. FIG. 3 shows the second position in which it faces the exposure unit C. In FIG. 2, the transfer pins 8A and 8B of the transfer mechanism B are aligned with the pins 4A and 4B, respectively, of the film support A. The suction members 9A and 9B, and the auxiliary frame 7 are driven to pick up the uppermost film 1 from a plurality of films on the film support A. Even if more than one film is about to be picked up, the separating member 5 ensures that only the uppermost film be picked up. The film 1 thus picked up has its apertures 2A and 2B engaged by the transfer pins 8A and 8B, respectively, of the transfer mechanism B, and is transferred as shown in FIG. 3.

Upon arrival of the transfer mechanism B at its position facing the exposure unit C as shown in FIG. 3, the transfer pins 8A and 8B are aligned with the pins 11A and 11B, respectively, on the drum 10. The suction members 9A and 9B, and the auxiliary frame 7 are driven to engage the film 1 with the pins on the drum 10. If the suction force is, then, removed from the suction members 9A and 9B, the film 1 is left on the drum 10. The film 1 is exposed to light, while it is maintained in intimate contact with the drum 10 by suction or like means not shown, and the drum 10 is rotated.

The exposed film 1 is removed from the surface of the drum 10 by means of a peeling pawl (not shown) during reversal rotation of the drum, and simultaneously the film is released from the suction members. The film is then dropped into a space between the guide members 12A, 12B of the film guide D and is transferred to a developing apparatus or the like.

Figure 4:
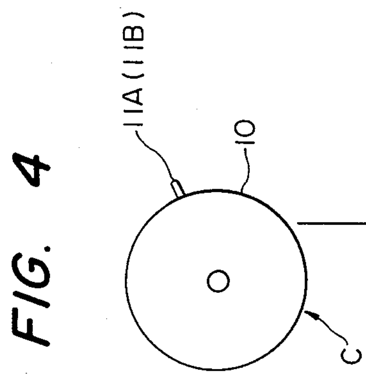
FIGS. 4 and 5 are fragmentary side elevation views of a second embodiment of the invention at different stages of operation.
Figure 5:
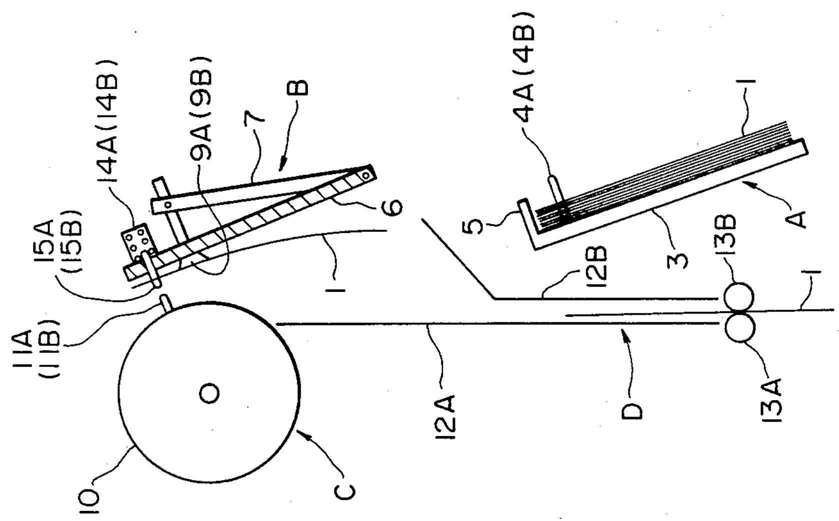

Referring to FIGS. 4 and 5, there is shown fragmentarily in side elevation a second embodiment of this invention. The numerals and letters used in FIGS. 2 and 3 are employed to designate like parts in FIGS. 4 and 5.

The apparatus of the embodiment of FIGS. 4 and 5 is characterized by employing movable transfer pins 15A and 15B which can be withdrawn into elastic supporting members 14A and 14B provided on the base frame 6, instead of the transfer pins 8A and 8B secured to the base frame 6 in the apparatus of FIGS. 2 and 3. The transfer mechanism B can, therefore, be brought into sufficiently close proximity to the film support A to pick up the film 1 quickly and correctly from the film support A. This feature is particularly advantageous when only a small number of films 1 are left on the film support A.

Referring to the operation of the apparatus shown in FIGS. 4 and 5, the transfer mechanism B remains in the position shown in FIG. 4 and the transfer pins 15A and 15B are aligned with the pins 4A and 4B, respectively, on the film support A, and the transfer mechanism B is brought into close proximity to the film support A. Because the pins 15A and 15B can be withdrawn into the elastic supporting members 14A and 14B, the transfer mechanism B can be brought into close proximity to the film support A as shown in FIG. 4. Then, the auxiliary frame 7 and the suction members 9A and 9B are placed in operation to pick up a film 1.

If the transfer mechanism B is moved away from the film support A, the transfer pins 15A and 15B are pushed out by springs which are provided in the supporting members 14A and 14B. The pins 15A and 15B may therefore be kept in engagement with the film 1 to prevent any displacement of the film 1 while it is being transferred. When the transfer mechanism B has been moved to its position facing the exposure unit C, it can likewise be brought into sufficiently close proximity to the exposure unit C to deliver the film thereto quickly and reliably.

Figure 6:
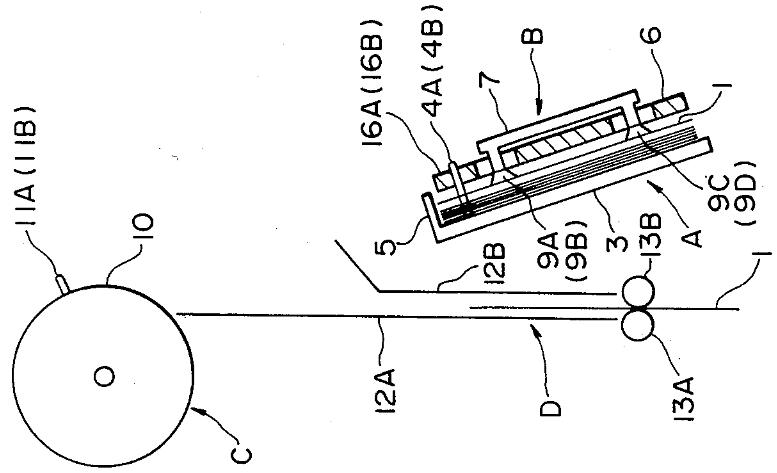
FIGS. 6 and 7 are fragmentary side elevation views of a third embodiment of the invention at different stages of operation.
Figure 7:
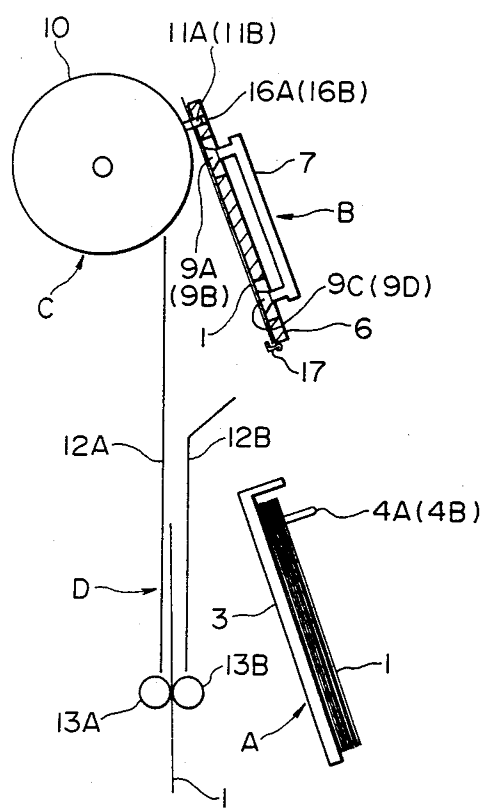

Referring now to FIGS. 6 and 7, a third embodiment is shown fragmentarily in side elevation. The numerals and letters used in FIGS. 2 to 5 are employed to designate like parts in FIGS. 6 and 7.

The apparatus of FIGS. 6 and 7 is characterized by the provision of aligning holes in the transfer mechanism B instead of the transfer pins which are alignable with the pins on the film support A or the positioning pins on the exposure unit C. In this embodiment, no transfer pins are employed on the transfer mechanism B.

Referring to the operation of the apparatus shown in FIGS. 6 and 7, the pins 4A and 4B on the film support A are engaged in the aligning holes 16A and 16B in the transfer mechanism B as shown in FIG. 6. The auxiliary frame 7 and the suction members 9A, 9B, 9C and 9D are actuated to pick up a film 1. At least the lower edge of the suction surface of the transfer mechanism B is preferably provided with a holding member 17 for preventing any displacement of the film being transferred, as shown only in FIG. 7. It is necessary for the holding member 17 to be downwardly retractable in FIG. 7 to release the film when it is picked up or delivered. This can be done by any known retraction mechanism.

Figure 8A:
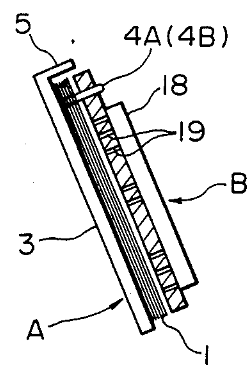
FIGS. 8A and 8B illustrate a modification of the transfer mechanism shown in FIGS. 6 and 7.
Figure 8B:
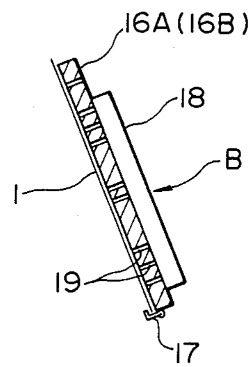

FIGS. 8(A) and (B) show a modification to the apparatus of FIGS. 6 and 7. The transfer mechanism B comprises a flat box-shaped suction means 18 provided with aligning holes 16A and 16B for pins 4A and 4B. FIG. 8(A) shows the transfer mechanism B disposed in its position facing the film support A to suck the uppermost film 1, while FIG. 8(B) shows the mechanism B in its process of transferring the film 1. It is preferable to provide a holding member 17 for preventing any displacement of the film 1 as shown in FIG. 8(B). The suction system 18 has, as shown in FIG. 8(A) and FIG. 8(B), a series of suction ports 19 to retain the film on the transfer surface.

Figure 9A:
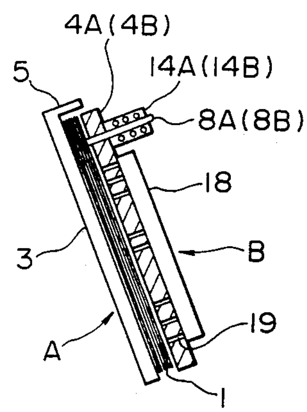
FIGS. 9A and 9B illustrate a second modification of the transfer device of FIGS. 6 and 7 employing retractable transfer pins of the embodiment of FIGS. 4 and 5.
Figure 9B:
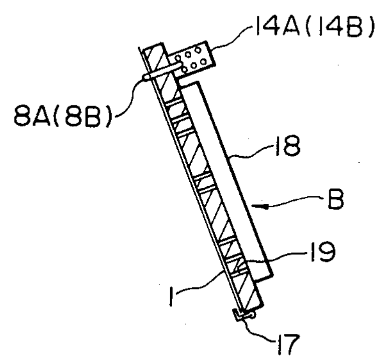

Referring to FIGS. 9(A) and 9(B), the flat box-shaped sucking means 18 in the apparatus of FIG. 8 is provided with the retractable transfer pins 8A and 8B in the apparatus of FIGS. 4 and 5. The apparatus can be operated in the same way as the apertures hereinabove described.

Although the film 1 has been described and shown as having a pair of positioning holes 2A and 2B, the number, shape and position of these holes may be selected freely in view of the entire system as hereinbefore stated. In order to facilitate the alignment of the pins 4A and 4B on the film support A and the positioning pins 11A and 11B on the exposure unit C with the transfer pins or aligning holes on the transfer mechanism B, it is possible to form those pins with rounded or tapered ends, and widen those holes at their inlets.

This invention is, of course, applicable to not only a lith film, but any other recording medium in sheet form as well. Moreover, it is possible to employ this invention for not only mounting a recording medium on an exposure unit as hereinbefore described by way of example, but also for feeding a printing machine.

According to this invention, it is advantageously possible to obtain an apparatus which is suitable for mounting a recording medium having positioning apertures on a mount having positioning pins which are engageable with those apertures, by virtue of a support having pins which are engageable with those apertures to support a plurality of recording mediums and a transfer mechanism which is reciprocatable between a first position in which the mechanism picks up one of the recording mediums from the support and a second position in which the mechanism delivers the recording medium to the mount, as hereinabove described.

What is claimed is:

1. Apparatus for mounting a recording medium having positioning apertures on a mount having positioning pins engageable with the apertures comprising; a support having pins engageable with apertures to support a plurality of recording mediums and, transfer means reciprocating between a first position to remove a recording medium from said support to a second position and transferring said recording medium to said mount.

2. An apparatus as set forth in claim 1, wherein said transfer means comprises transfer pins alignable with said pins on said support in said first position, and said positioning pins in said second position, said transfer pins engageable with said recording medium during its transfer, and suction means adapted to remove one recording medium from said support in said first position, and release it in said second position to deliver it to said mount.

3. An apparatus as set forth in claim 2, wherein said suction means are extendable relative to said transfer means to engage a recording medium in said first position and retracted in said second position so that said transfer pins confront both said pins on said support and said positioning pins respectively in said first and second positions.

4. An apparatus as set forth in claim 1, wherein said transfer means comprises transfer pins alignable with said support pins in said first position, and said positioning pins in said second position, and engageable with one recording medium during its transfer, suction means adapted to remove one recording medium from said support in said first position, and release it in said second position to deliver it to said mount, and means for supporting said transfer pins movably when said transfer pins are aligned with said support pins in said first position, or said positioning pins in said second position.

5. An apparatus as set forth in claim 4, wherein said means for supporting comprises elastic supporting members into which said transfer pins retract in said second position.

6. An apparatus as set forth in claim 1, wherein said transfer means comprises means defining holes alignable with said support pins in said first position to receive said support pins therein, and alignable with said positioning pins in said second position to receive said positioning pins therein, and suction means adapted to remove one recording medium from said support in said first position, and release it in said second position to deliver it to said mount.

7. An apparatus as set forth in claim 6, further comprising a retractable holding member on said transfer means to prevent said recording medium from shifting position during travel from said first position to said second position.

8. An apparatus as set forth in claim 6, wherein said suction means comprises a flat suction source and a series of conduits in said transfer means to retain said recording means.

9. An apparatus as set forth in claim 4, wherein said transfer mechanism said suction means comprises a flat suction source and a series of conduits in said transfer means to retain said recording means.

* * * * *